(12) United States Patent
Olea

(10) Patent No.: US 7,949,025 B2
(45) Date of Patent: May 24, 2011

(54) LASER OPTICS INTEGRATED CONTROL SYSTEM AND METHOD OF OPERATION

(75) Inventor: Jorge Sanchez Olea, Poway, CA (US)

(73) Assignee: Tecey Software Development KG, LLC, Dover, DE (US)

( * ) Notice: Subject to any disclaimer, the term of this patent is extended or adjusted under 35 U.S.C. 154(b) by 1127 days.

(21) Appl. No.: 10/513,104

(22) PCT Filed: Dec. 21, 2002

(86) PCT No.: PCT/US02/40940
§ 371 (c)(1),
(2), (4) Date: Dec. 12, 2005

(87) PCT Pub. No.: WO03/058827
PCT Pub. Date: Jul. 17, 2003

(65) Prior Publication Data
US 2006/0098699 A1 May 11, 2006

Related U.S. Application Data

(60) Provisional application No. 60/344,177, filed on Dec. 27, 2001.

(51) Int. Cl.
*H01S 3/00* (2006.01)
(52) U.S. Cl. .................... 372/38.02; 372/38.1
(58) Field of Classification Search .............. 372/38.02, 372/38.1
See application file for complete search history.

(56) References Cited

U.S. PATENT DOCUMENTS

| 4,858,220 A | 8/1989 | Funada |
| 5,019,769 A * | 5/1991 | Levinson ............... 372/31 |
| 5,334,826 A | 8/1994 | Sato et al. |
| 5,383,208 A | 1/1995 | Queniat et al. |
| 5,812,572 A * | 9/1998 | King et al. ............ 372/38.04 |

(Continued)

FOREIGN PATENT DOCUMENTS
EP   0 823 759   2/1998

OTHER PUBLICATIONS
International Search Report for PCT/US02/040940, mailed Apr. 4, 2003.
(Continued)

*Primary Examiner* — Minsun Harvey
*Assistant Examiner* — Phillip Nguyen
(74) *Attorney, Agent, or Firm* — Schwabe, Williamson & Wyatt, P.C.

(57) ABSTRACT

A controller (320) for controlling various operational parameters of the Laser Module (303). The modulation drive signal (300) causes the circuits in the driver (301) to send a signal to the output (302) so that the laser can send an optical power output (304) proportional to the drive signal (300). The control methods in Laser Controller IC (320) consist of control algorithms embedded in firmware. The Laser Controller IC (320) includes support circuits for control of a laser. Some of the distinguishing features in the present invention are 1) feedback information from the sensors is obtained in a synchronous manner as a snapshot of the laser performance, and 2) algorithms handle the entire set of controls in firmware. The algorithm feature allows for advanced servo controls, which precisely stabilize the laser, can accommodate adaptive controls, and can be leveraged from one laser transmitter design to another.

34 Claims, 5 Drawing Sheets

U.S. PATENT DOCUMENTS

| | | | |
|---|---|---|---|
| 5,844,928 A * | 12/1998 | Shastri et al. | 372/38.02 |
| 5,978,393 A * | 11/1999 | Feldman et al. | 372/31 |
| RE36,491 E | 1/2000 | Gilliland et al. | |
| 6,028,423 A | 2/2000 | Sanchez | |
| 6,055,252 A * | 4/2000 | Zhang | 372/34 |
| 6,292,497 B1 * | 9/2001 | Nakano | 372/29.015 |
| 6,446,867 B1 | 9/2002 | Sanchez | |
| 6,494,370 B1 | 12/2002 | Sanchez | |
| 6,629,638 B1 | 10/2003 | Sanchez | |
| 6,788,719 B2 * | 9/2004 | Crowder | 372/38.02 |
| 6,947,456 B2 | 9/2005 | Chin et al. | |
| 2002/0105982 A1 * | 8/2002 | Chin et al. | 372/38.02 |
| 2003/0010988 A1 * | 1/2003 | Franson | 257/88 |
| 2003/0138024 A1 * | 7/2003 | Williamson et al. | 372/108 |
| 2005/0030985 A1 * | 2/2005 | Diaz et al. | 372/29.015 |
| 2005/0271101 A1 * | 12/2005 | Diaz et al. | 372/38.02 |

OTHER PUBLICATIONS

Supplemental European Search Report for EP02795984, mailed Aug. 11, 2005.

Office action for EP02795984, mailed Mar. 30, 2006.

Office action for EP02795984, mailed Mar. 7, 2007.

Summons for EP02795984, mailed Oct. 17, 2008.

* cited by examiner

Figure 1.
Prior Art. Analog Controller

Figure 2.
Mixed analog/digital control system

Fig 4. Integrated Laser Communications Controller

LASER OPTICS INTEGRATED CONTROL SYSTEM AND METHOD OF OPERATION

CROSS REFERENCES TO RELATED APPLICATIONS

This application is a U.S. national stage entry under 35 U.S.C. § 371of PCT/US2002/040940, filed Dec. 21, 2002, which in turn claims priority to provisional application Ser. No. 60/344,177, filed Dec. 27, 2001, entitled "Integrated Communications Controller and Method of Operation."

BACKGROUND

The invention relates to a Laser Feedback Control System. The control system utilizes algorithms of modern digital controls and utilizes a laser controller Integrated Circuit. Use of edge emitter lasers for high performance long haul and metropolitan networks will continue in high performance applications including wavelength division multiplexing. VCSEL arrays have been used increasingly in fiber optics telecommunication due to their low cost. Widespread use will place increasing demands on performance of all elements of the electrical to optical interface. Increasing speed of computers will place increased demands on the performance of transmitters using VCSELs. All network applications are a fast growing market. The market is demanding low cost and short development time with an increased level of reliability and intelligence in the transmission systems.

Prior art has attempted various methods to control lasers. Levinson, in U.S. Pat. No. 5,019,769, dated May 28, 1991, described a semiconductor laser diode controller and laser diode biasing control method. Although a programmed microcontroller is disclosed, a limitation to Levinson is the teaching is to only " . . . accurately controlling the process of turning on and selecting the operating point of the laser diode." More specifically, Levinson is directed " . . . preventing light from the laser diode's from accidentally damaging user's eyes." Levinson does not appear to disclose an integrated circuit solution. The micro controller is used in a hardware adjustment mechanism rather than for servo computations. Levinson teaches away from the present invention. On the other hand, in the present invention, algorithms handle the entire set of controls in firmware and do not rely on analog closed loop controls. This feature allows for advanced controls, which precisely stabilize the laser, can accommodate adaptive controls and can be leveraged from one laser transmitter design to another.

King, et al. In U.S. Pat. No. 5,812,572, dated Sep. 22, 1998, discloses intelligent fiberoptic transmitters and methods of operating and manufacturing the same. Intelligent fiberoptic/laser diode transmitter/controller modules and methods of operating and manufacturing the same are disclosed. "During calibration procedures for the modules, a laser diode is characterized over a defined operating temperature range." . . . "During operation, an embedded microcontroller together with analog to digital converters, digital to analog converters and other associated circuitry, dynamically control the operational parameters (e.g. modulation and bias current) based on the current operating conditions (temperature, power supply) ." A limitation of King, et al is the limited scope of the disclosure. King, et al appears to teach away from an integrated circuit solution. More specifically, a micro controller is used in a hardware adjustment mechanism rather than for servo computations. In addition, King, et al discloses characterizing of a laser diode. On the other hand, the present invention uses algorithms to handle the entire set of controls in firmware and does not rely on analog closed loop controls. This feature allows for advanced controls, which precisely stabilize the laser, can accommodate adaptive controls and can be leveraged from one laser transmitter design to another. The present invention also discloses an operating system, advanced servo control methods, and adaptive, reconfigurable controls in an integrated control system.

Still another patent in prior art is Sanchez, in U.S. Pat. No. 6,494,370, dated Dec. 17, 2002. Sanchez is the inventor of the present invention as well. However, U.S. Pat. No. 6,494,370, is an electro-optic system controller and method of operation disclosing a method for calibrating a laser module system. This disclosure is more limited in scope than the present invention because it focuses on some hardware aspects of controls.

Other prior art is discussed below.

Figure 1:
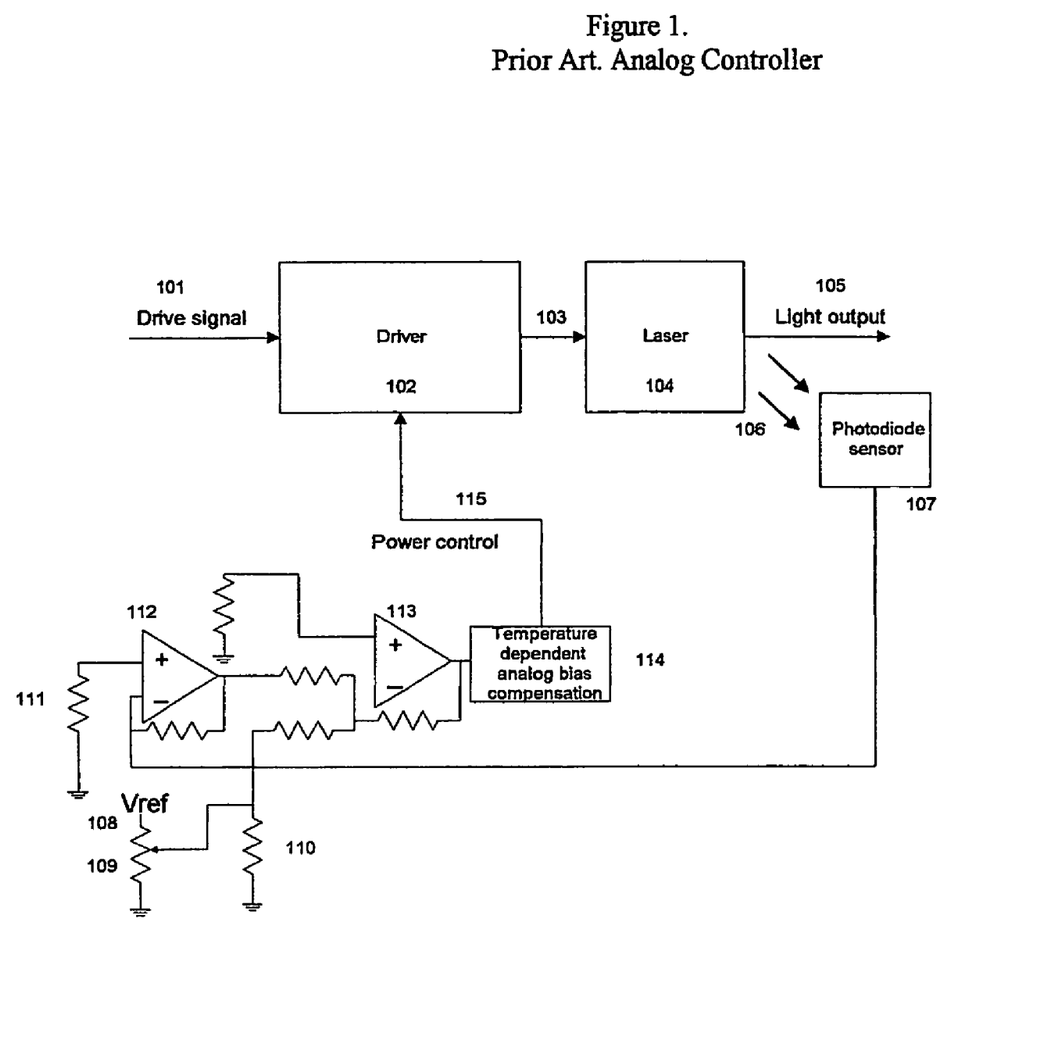
FIG. 1 illustrates a typical analog control system from prior art.

Some control systems as shown in FIG. 1, utilize analog controllers. Adjustment of laser power with changes in temperature is done by a temperature sensitive device, which adds compensation current to the laser drive. This approach is made with fixed controls that need to be hardwired for each application. Because of that reason this implementation reduces the possibilities for modifications and the possibilities for leveraging from one product generation to another.

Other methods are utilized for controlling the more complex applications of wavelength division multiplexing WDM have utilized some elements of closed loop control but generally only for stabilizing the wavelength of the laser with a wavelength locker.

Other approaches consist of open loop drivers with costly characterization of the laser/VCSEL array.

Figure 2:
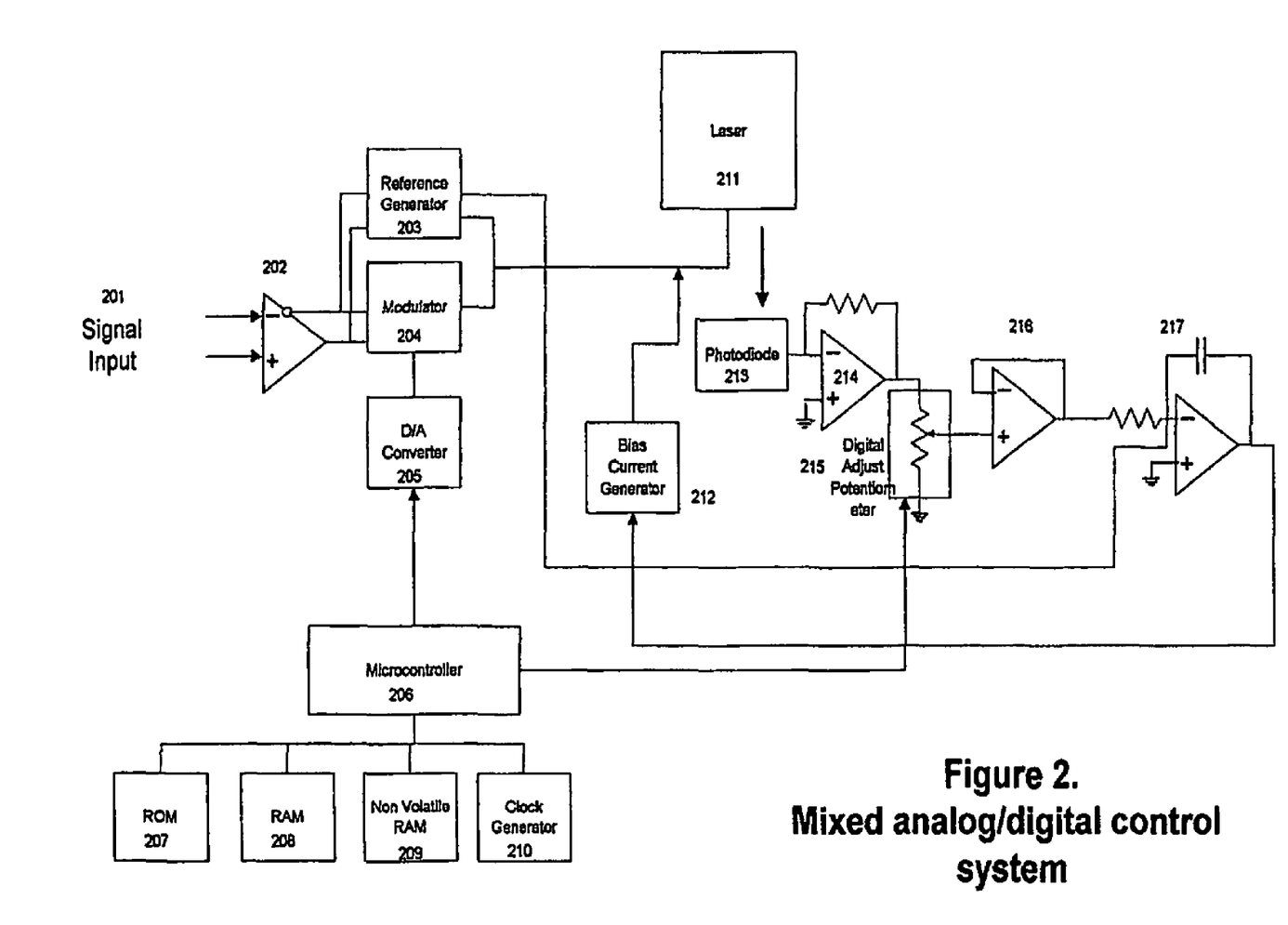
FIG. 2 illustrates a mixed analog/digital control system from prior art.

An example of a more elaborate control system is shown in FIG. 2. The system accommodates for an initial characterization of the laser at all temperatures. In this control system, a photodiode-monitoring laser output power is used as feedback. The photodiode characteristic is digitally adjusted at the factory with a D/A converter and a microprocessor. This adjustment is in lieu of a mechanical potentiometer and it is used for an initial adjustment of the photodiode and to compensate for deficiencies of the photodiode with temperature. It is significant that in FIG. 2, the control loop is still an analog control loop. The difference between the loop in FIG. 2 and a digital control loop is that in a digital control loop, the magnitude of the laser drive signal is determined in a digital process. For example, the photodiode signal is first digitized, the processor then utilizes calibration and adjustment algorithms to determine what the drive signal magnitude should be, and finally, a D/A converter is used to control the driver so it produces the correct magnitude of the drive current. In contrast, in a digital control system, the signals are immediately digitized, all of the signal processing for a servo system is carried out in the controller firmware and then the excitation/control of the laser is done with the D/A converters controlling the driver. This allows for complex signal processing to be done in the firmware.

The analog circuits utilize complex analog topologies, which are difficult to leverage, support and calibrate. The analog parts also require a significant effort in maintaining component quality in production.

Other deficiencies of analog control systems are in the way the control algorithms are implemented. Adjustments are made for power control but utilize very basic methods of control because a significant set of the decisions and calculations are done with analog components. For example, the laser power control is done with a system that makes adjustments based on deviations from a set point with a resulting in on-off adjustments rather than a servo system.

Prior solutions do not effectively leverage solutions from one product to another because they are based on fixed hardwired design implementations of a control system.

Prior solutions rely on a multiplicity of integrated circuits and components that are chosen every time the laser system is designed. This situation causes a larger set of packages to be utilized increasing costs and decreasing reliability.

Another issue of the known prior art methods is that complex issues need to be decided very early in the projects. With rigid hardwired implementations (rather than programmable which can be implemented late in the project) the options are reduced thus increasing risk.

SUMMARY OF THE INVENTION

Figure 3:
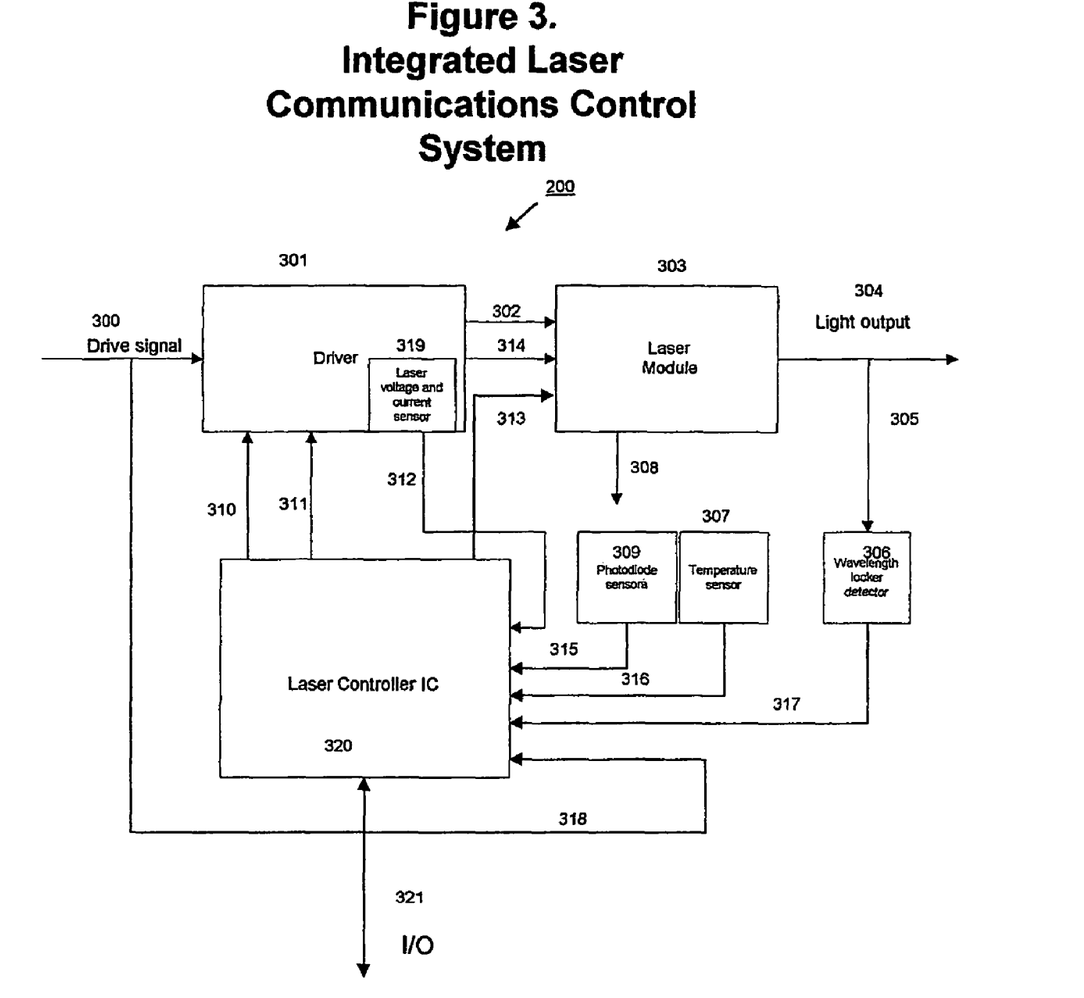
FIG. 3 illustrates a block diagram of the control system of the present invention.

In reference to FIG. 3, the control system (200) consists of an apparatus containing a digital controller IC (320), a driver (301), a set of sensors (306,307,309,319) and digital control methods embedded in controller IC (320). The control system contains the necessary features to control the various operational parameters of the Laser Module (303).

The control first starts with a modulation drive signal (300); the drive signal causes the circuits in the driver (301) to send an appropriate signal to the output (302) so that the laser can send an optical power output (304) proportional to the input signal (300). The Laser Module (303) may contain a semiconductor laser or a VCSEL laser array and also may contain the necessary features to tune the laser wavelength. The control methods embedded in Laser Controller IC (320) consist of control algorithms embedded in firmware. The Laser Controller IC (320) includes the necessary support circuits for control of a laser. The circuits in the controller may include among other circuits digital functions such as a processor, ROM, RAM non volatile RAM, clock, reset, I/O. Mixed analog and digital features include one or more digital to analog converters, potentiometer, sample and hold amplifiers, analog multiplexer, programmable gain amplifier analog multiplexer, programmable gain amplifier, analog to digital converter, operational amplifiers. Power control circuits include a laser power control latch, a laser power switch and a laser overvoltage and transient control protection circuit. Other possible circuits may include optical link characterization support circuits such as a precision voltage reference and a reference drive switch for analog signal support and a set of Optical Link Characterization circuits, which provide support for such as bit error rate determination.

The control system architecture can control one or more lasers or a VCSEL array by a change in the type of driver. Some of the distinguishing features of the control system in the present invention from the prior art are:

Feedback information from the sensors is obtained in a synchronous manner as a "snapshot" of the laser performance utilizing either Sample/Hold devices or by very rapid sampling of the feedback information.

Algorithms handle the entire set of controls in firmware and do not rely on analog closed loop controls. This feature allows for advanced controls, which precisely stabilize the laser, can accommodate adaptive controls and can be leveraged from one laser transmitter design to another.

A novel feature of the invention is that the apparatus will interface with the set of sensors typically needed to determine the state of the laser system under control. These sensors may include a temperature sensor, power sensor, and current sensor or wavelength sensor.

Another novel feature of the present invention is that the control processes implemented in the algorithms define the "plant characterization". This information fully characterizes the laser and sensors. Preferably, the characterization is carried out only during product development rather than during production test. The characterization allows for a precise real-time control of the laser.

A third novel feature of the invention is a set of advanced digital control algorithms. The algorithms sample the feedback variables, perform the necessary computations to carry out a real-time response and then set the output variables needed to simultaneously operate on the laser system in order to maintain the set point for the optical signal output. This closed loop control is done for all of the output variables with a servo control approach.

Still another unique feature of the invention is it is a Universal Control System in that it can adapt the control to different lasers or VCSEL arrays. The control system requires a change in firmware parameters in order to adapt to the different type of laser Yet another unique feature of the present invention is that a complete set of specialized features needed for laser feedback control systems are incorporated into one integrated circuit, which substantially increases reliability and reduces cost of the laser transmitter.

Finally, other novel features of this invention are in the Methods of Operation. These methods include a real time operating system for a laser transceiver. The operating system allows for a structured approach that offers significant leveraging of the firmware resources by the different programs that are embedded in the controller. In addition, the operating system facilitates interconnection and compatibility of firmware programs written by different programmers in a standardized manner, which promotes leveraging of programs from one product generation to another and also allows programs from various vendors to connect to each other in an orderly fashion.

DESCRIPTION OF THE PREFERRED EMBODIMENTS

Apparatus

FIG. 1 illustrates a typical analog control system from prior art. This control system utilizes analog controllers. Adjustment of laser power with changes in temperature is done by a temperature sensitive device, which adds compensation current to the laser drive. This approach is made with fixed controls that need to be hardwired for each application. Because of that reason this implementation reduces the possibilities for modifications and the possibilities for leveraging from one product generation to another.

FIG. 2 illustrates a mixed analog/digital control system from prior art. This system is an example of a more elaborate control system. The system accommodates an initial characterization of the laser at all temperatures. In this control system, a photodiode-monitoring laser output power is used as feedback. It is significant that in FIG. 2, the control loop is still an analog control loop. The difference between the loop in FIG. 2 and a digital control loop, as in the present invention, the magnitude of the laser drive signal is determined in a digital process. In a digital control system, the signals are immediately digitized, all of the signal processing is carried out in the controller firmware and then the excitation/control of the laser is done with the D/A converters controlling the driver. This allows for complex signal processing to be done in the firmware.

FIG. 3 illustrates a block diagram of the control system of the present invention. FIG. 3 contains the architecture of the Integrated Laser Communications Control System (200). The Control System (200) consists of a Driver (301), a Laser Controller IC (320), a set of Sensors (306, 307, 309, 319) and control algorithms that are embedded in the Laser Controller IC (320). The control system is used to provide all of the necessary functions required to operate properly the Laser Module (303) in order to produce the required Laser Light Output (304). The Driver (301) takes as inputs Drive Signal (300), Modulation Signal Control (310), and Bias Signal Control (311). The Driver (301) then produces Laser Voltage and Current Sense Signals (319). The Driver (301) also produces Modulation Current (302) and Bias Current (314). The Laser Module (303) utilizes Modulation Current (302) and Bias Current (314) to produce the Required Light Output (304).

The feedback Sensor information consists of a variety of Laser Performance Parameters: A portion of the Light Output from the Laser Module (303) is sent through an Optical Path (308) to the Photodiode Sensor (309) in order to determine Laser Power Output. In some cases additional Photodiode Sensors are utilized to determine the Laser performance for applications such as Wavelength Division Multiplexing. A portion of the Laser Light Output (304) may be sensed at 305 and coupled to the Wavelength Locker (306) in order to determine the Wavelength of the Light Output (304). A Temperature Sensor (307) is utilized to determine the temperature of the Laser Module (303). The Laser Voltage and Current Sense Circuits (319) are utilized to provide feedback information on the various currents and voltages that are applied to the laser. The Drive Signal Feedback (300) sends Feedback (318) to the Laser Controller IC (320) in order to provide real time information of the magnitude of the Drive Signal (300).

The Laser Controller IC (320) may utilize as inputs one or more of the following: Laser Voltage and Current Sense (312), Photodiode Sensor(s) Output (315). Temperature Sensor Output (316), Wavelength Locker Output (317) and Input Drive Signal (318). Which Sensors are utilized by the controller is dependent on the type of Laser that is being controlled. The Laser Controller IC (320) first digitizes the sensor information. Afterwards, the Control System Algorithms, which are embedded in the Laser Controller IC (320), will determine what are the appropriate feedback controls to be applied to the Driver (301) and the Laser Module (303). The Laser Controller IC (320) produces Modulation Control (310) that is applied to the Driver (301) and controls the magnitude of the Modulation Current (302) that is applied to the Laser Module (303). The Laser Controller IC (320) produces Bias Current Control (311) that is applied to the Driver (301) and controls the magnitude of the Bias Current (314) that is applied to the Laser Module (303). For Wavelength Division Multiplexing Systems, the Laser Controller IC (320) also provides one or more Laser Wavelength Tuning Outputs (313). The Wavelength Tuning Outputs (313) are utilized by the Laser Module (303) to modify the Wavelength of the Light Output (304).

Figure 4:
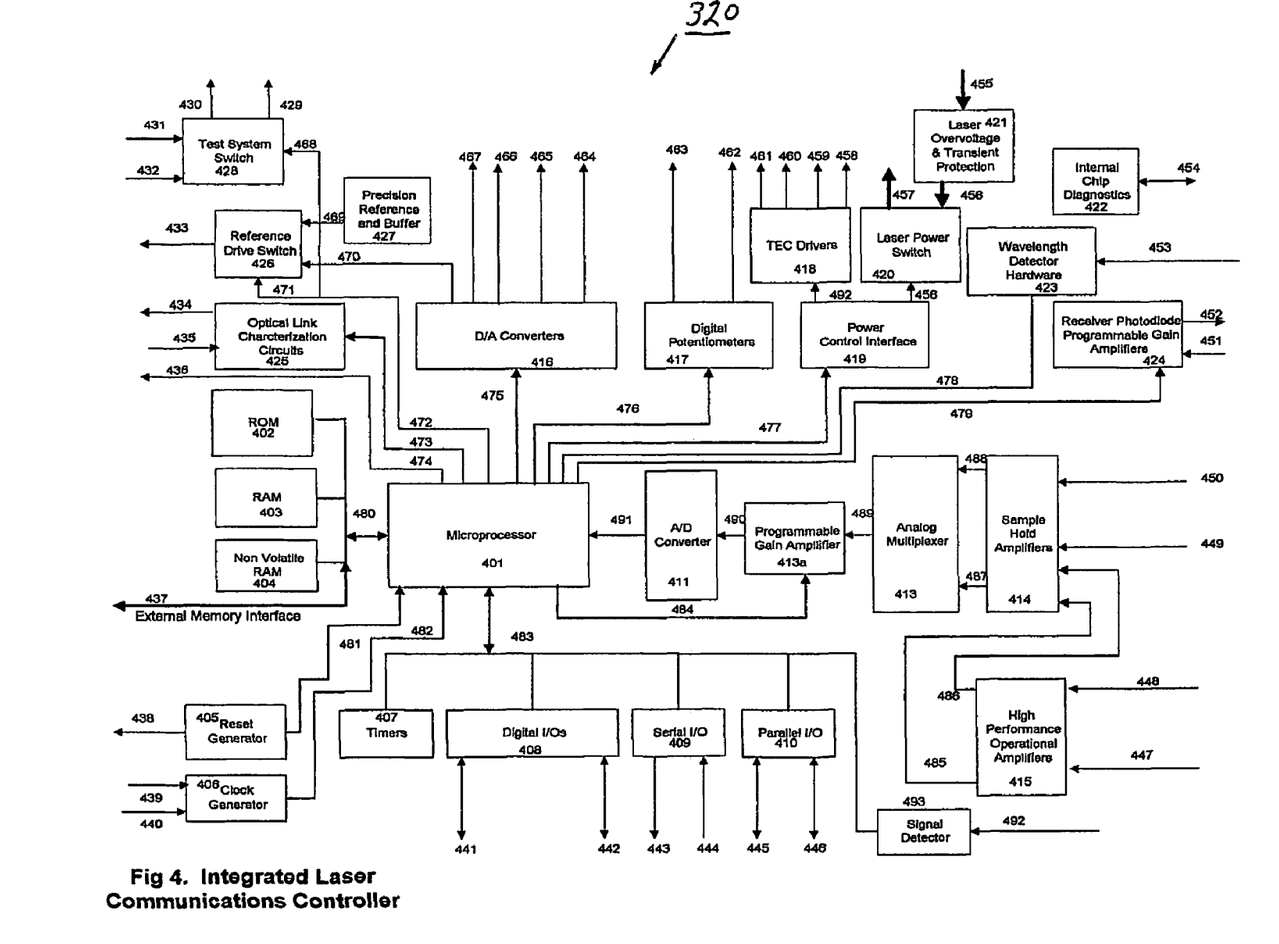
FIG. 4 illustrates a block diagram of the Integrated Laser Communications Controller (320) of the present invention.

FIG. 4 illustrates a block diagram of the Integrated Laser Communications Controller (320) of the present invention. FIG. 4 shows the architecture for the Integrated Laser Communications Controller (320). The Communications Controller is implemented in an Integrated Circuit and contains all of the support circuitry required by the Feedback Control System to Control with precision a laser. The Integrated Circuit contains mixed signal circuits, which include digital and analog circuit, which may be manufactured in various available technologies such as Complementary Mosfet Technology. The Integrated Circuit also hosts the embedded firmware, which contains the Control System Algorithms. Not all of the circuits may be required for a given control system. How the circuits are utilized is dependent on the laser application used. The digital portion of the Laser ControllerIC (320) consists of a Microprocessor (401), which carries out the arithmetic, logical and program execution operations. The memory related circuits consist of a Read Only Memory (ROM) (402) which stores the embedded firmware. RAM (403), non-Volatile RAM (404) utilized to store additional information during run time. The additional information may consist of parameters that adapt the Laser Control System (200) to a specific laser. The memory related circuits are connected with Bus (480) to the Microprocessor (401). The Bus (480) also is available to the outside of the Integrated Laser Communications Controller as an External Memory Interface (437). This interface is used for additional external ROM or other fast storage or functional circuits used to extend the capability of the Laser Communications Controller (320). Other digital functions consist of a Reset Generator (405) that generates a reset pulse during power up. The Reset Generator is connected to the Microprocessor (401) with the Reset Line (481). The Reset Generator also can drive external circuits with a Reset Output (438). The Microprocessor (401) utilized a Clock Input Line (482), which is sent by the Clock Generator (406). The Laser Controller IC can also utilize an external clock by means of the Differential Lines (439,440). Additional functions are provides by a set of Timers (407), General Purpose Digital I/Os (408). The Laser Communications Controller (320) may preferably contain 8 or more Digital I/Os (408), which are available for external functions through pins at (441-442). External communications to a host computer is made using a Serial I/O (409). The Serial I/O (409) may be an RS 232 type or an USB type of communications interface. The Serial I/O (409) is available through pins at (443,444). The Microprocessor (401) utilizes internal Bus (483) to connect to the Timers (407), Digital I/Os (408) and Serial I/O (409). Internal Bus (483) may also connect to a Parallel I/O (410), which connects to a host computer through pins (445-446).

The mixed signal portion of the Laser Controller Integrated Circuit starts with Sensor Inputs (447-448). These inputs connect to a set of Operational Amplifiers (415). The Amplifiers (415) are of high performance and are utilized to carry out conversion of monitoring Photodiode Current to a voltage with a high degree of precision and linearity. Other uses for the Amplifiers is to sense that Drive Signal (300) so that the Control System can obtain real time information of the magnitude of the Drive Signal (300). For some digital systems it is possible to receive the input signal at (492), into a Signal Detector (493), which connects to the Internal Bus (483). The Signal Detector (493) assists the Microprocessor (401) in determining an integral of the Modulation Current in order to perform any needed adjustments to the laser drive. The outputs (485-486) of the Operational Amplifiers (415) are connected to a set of Sample Hold Amplifiers (414). The function of the Sample Hold Amplifiers (414) is to obtain a snap shot in time of all of the feedback information that comes from all of the Sensor Inputs (439-450). The sensor feedback information is synchronized and provides the control system with the necessary means to implement a Servo System Control of the laser parameters. This feature is an important improvement of this invention in that the laser parameters are maintained with a real time Servo control as opposed to an on and off control system algorithm. The Sample Hold Amplifiers (414) send Outputs (487-488) to the Analog Multiplexer (413). The Output of the Multiplexer (489) sends the output to the input of the Programmable Gain Amplifier (413*a*). The Programmable Gain Amplifier (413*a*) is controlled by the Microprocessor (401) through Control Line (484) and is capable of adapting for different levels of feedback information from Sensor Feedback Inputs (449-450). The Programmable Gain Amplifier (411) is connected through (490) to the Analog to Digital Converter (411). The Analog to Digital Converter contains the appropriate level of precision required by the control system. Typically it provides a resolution of 12 bits. The Analog to Digital Converter (411) provides the digitized sensor information to the Microprocessor (401). This is done by means of connections (491), which may be serial or parallel.

The Integrated Laser Communications Controller (320) in FIG. 4 ensures that the laser is protected during power transients, ESD transients, over voltage or transients during power up. Laser protection starts with the use of a Power Control Interface (419). This contains a latch that disables the laser power when the system is first energized during a power operation The Power Control Interface (419) can be placed in a state that energizes the laser power by means of Control Lines (477) coming from the Microprocessor (401). Laser Power is enabled after any possible transients that occur during power up have died out. The Power Control Interface (419) controls the Laser Power Switch (420) by means of the Drive Signal (456). The Laser Power Switch (420) contains Drive Transistors, which provide DC power to the laser through a pin at (457). For high power lasers external power transistors may be utilized in conjunction with the output at pin (457). The Power Supply Voltage (455) first enters an over voltage and Transient Protection Circuit (421), which ensures that the DC Power (455) utilized to power the laser will be free from damaging ESD transients, and over voltage on the Power Supply Lines (455). The Power Control Interface (419) also utilizes data lines (492) to control a set of TEC Drivers (418). These drivers provide a multiplicity of power outputs (458,459,460,461), which are utilized to control turn on sequencing of power drivers used to run Thermo-Electric Coolers/Heaters (TEC). The TEC is used to maintain laser and other optical devices at a constant temperature for critical applications such as Dense Wavelength Division Multiplexing.

Bias and Modulation Current Control of the lasers can be carried out by the utilization of D/A Converters or with Digital Potentiometers. Which of these devices are utilized is dependent on the configuration of the circuits in the Driver (301). If the Driver (301) contains current mirrors that are set with a resistor of a given value, then the Digital Potentiometers (417) are utilized to control the currents in this case output (462) is connected to the driver in order to provide a resistance value utilized to control the magnitude of the modulation current. At the same time, the output pin (463) is also connected to the driver in order to provide a resistance value utilized to control the magnitude of the Bias Current The resistance in the Digital Potentiometers (462-463) is set by Control Lines (476) coming from the Microprocessor (401). If the Driver (301) contains current mirrors that can be set by controlling the current in a transistor such as in a voltage controlled current source configuration, then D/A converter outputs can be utilized to set the currents. In this case, D/A Converters (416) are utilized to set the modulation in Bias Currents. Output (464) from D/A Converter (416) is a voltage output and will control the magnitude of the modulation current for the laser. Output (465) from the D/A Converter (416) is a voltage output and will control the magnitude of the Bias Current for the laser. Other outputs from the D/A Converters (416) control other system functions such as Laser Wavelength Tuning Outputs (466,467). Alternatively D/A Converter (416) may contain additional multiple outputs, which can provide high resolution voltage outputs that can be utilized to tune the wavelength of multiple lasers such as for a Tunable VCSEL laser array. These outputs provide currents that are capable of driving semiconductor devices such as Bragg Gratings. Signal (470) is an output from the D/A Converter (416), which provides a synthesized voltage to be used for calibration purposes by an Analog Laser Transmitter. The bank of D/A Converters (416) is controlled by Control Lines (475) being driven by the Microprocessor (401).

The Integrated Laser Communications Controller (320) contains features used to characterize laser communication links. In a typical laser communication link, a special drive signal is applied to the laser. The information is sent through the communications link, and is received at the destination of the link. The information is then returned to our initial laser transmitter, sensed by means of an optical receiver channel and then returned to the Integrated Laser Communications Controller so that a determination can be made as to the value of critical parameters such as Channel Signal to Noise ratio, Bit Error Rate (BER), Wavelength or other parameters. Analog Characterization is facilitated by a signal at (433) provided by the Reference Data Switch (426). The switch is controlled by the Microprocessor (401), which selects either Precision Reference (427) or a synthesized Signal (470). Control Signal (471) selects which input to the Reference Data Switch (426) connects to the Output (433). Digital Channel Characterization is accomplished by an output serial stream of data (434), generated by the Optical Link Characterization Circuits (425). These circuits generate an appropriate stream of digital information used to determine parameters such as bit error rate (BER). The returning information from the opposite end of the communication channel is received at input 435. The Optical Link Characterization Circuits (425) are controlled with signal (426) being driven by the Microprocessor (401). In order to assist in switching between the test signal (435), the input signal into the driver, and a returning signal from a remote transceiver, a Test System Switch (TSS) (428) is utilized. The switch is controlled by the Microprocessor (401) with control line (468). The TSS is capable of connecting a multiple of signals (431-432) to a multiple set of outputs (421-430). The Microprocessor (401) also provides a special signal (436) utilized to control other Link Characterization Switches.

The Integrated Laser Communications Controller (320) also contains a block of circuits for Internal Chip Diagnostics (422), which provide a test interface (454). These circuits are used to trouble shoot the hardware and may also provide a JTAG interface. Other circuits may include Wavelength Detector Hardware (423). This hardware interfaces with inputs signals (453) to other possible electro-optical devices utilized to detect wavelength. The Wavelength Detector Hardware (423) communicates through interface (428) with the Microprocessor (401).

The Controller (320) may contain programmable gain amplifiers (424) used to receive signals from a photodiode through input (451). Once the photodiode signal (479) is amplified, it is sent to the rest of the transceiver through output (452). The programmable gain amplifier (424) is controlled by the Microprocessor (401) through the control line (479).

Methods Of Operation

Figure 5:
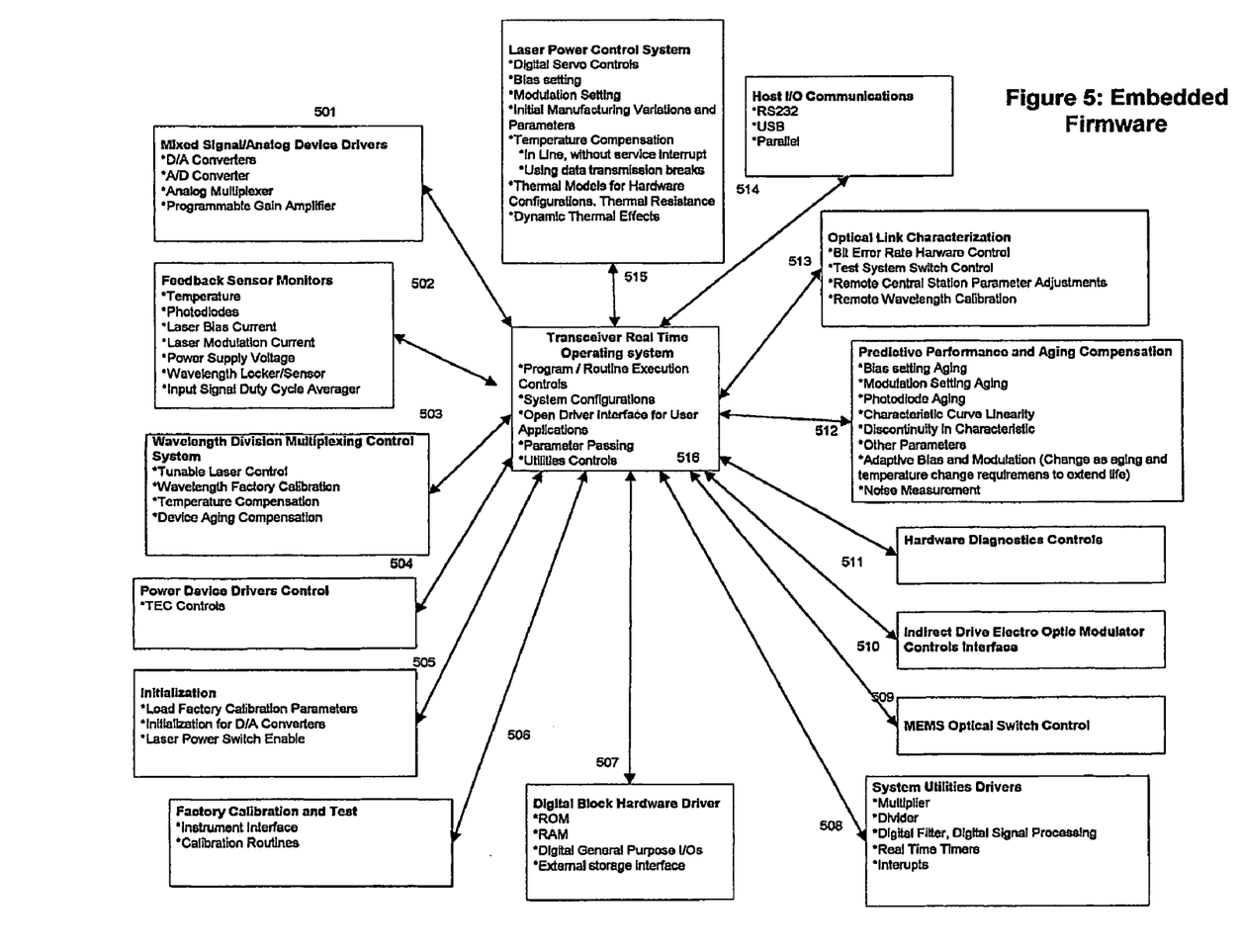
FIG. 5 illustrates the methods of operation, comprising a real-time operating system.

FIG. 5 illustrates the methods of operation, comprising a real-time operating system. FIG. 5 is a diagram of the firmware imbedded in the Laser Communications Controller (320). The firmware contains the methods of operations for the Laser Communications Controller (320). There are methods of operations corresponding to the various blocks of circuits that need to be controlled in the various algorithms for executing control. Functionality of the firmware is orchestrated by a Transceiver Real-Time Operating System (516). The Operating System (516) controls the execution of programs and routines, and forms an open driver interface for various user application programs. Among other functions of the Operating System (516) are parameter passing and configuration of the System (516). This allows for leveraging of programs from one product generation to another, allows for connecting special programs from the user to the transceiver controls and allows utilization of built in facilities such as special drivers and utilities. The Operating System (516) is a Real Time Operating System in the sense that it responds to the requests of the various Servo Systems in a prescribed period of time so that the control variables do not drift away from the desired set point.

The hardware is controlled by Mixed Signal/Analog Device Drivers (501). These drivers control the various blocks analog and digital hardware such as D/A Converters, A/D Converter, Analog Multiplexer, Programmable Gain Amplifier and Receiver Photodiode Gain Amplifier. Other built in programs are the Feedback Sensor Monitors (502). These routines acquire information from Temperature Sensor, Photodiodes, Laser Bias Current, Laser Modulation Current, Power Supply Voltage, Wavelength Locker/Sensor, and an Input Signal Duty Cycle Averager. Wavelength Division Multiplexing controls (503) is carried out by a Servo System, which insures continuous real time adjustment of the Laser Wavelength. For this purpose the Servo System performs the necessary functions for calibrating the Wavelength at the factory, compensating for temperature changes and for device ageing. Power Device Drivers Control (504) is used to control the various hardware drivers utilized to control a Thermo-Electric Cooler used to maintain the laser temperature at a constant value. Initialization (505) is run when the power of the transceiver is first turned on. It performs the initial load of factory calibration parameters, initialization of D/A Converters, and supportive system registers. Finally, once the Servo System utilized to control laser power is ready, the Initialization (505) turns on the Laser Power Switch Enable which connects the power supply to the laser when the system has stabilized and there are no transients which could damage the laser. The Factory Calibration And Test (506) provides interfaces to test and measurement equipment and provides routines for calibrating the various control systems and devices in the Communications System at the end of the assembly line. The Digital Block Hardware Driver (507) controls the ROM, RAM, Digital General Purpose I/Os in the External Memory Interface. System Utilities Driver (506) is provided by the Operating System to the various programs being executed. The Drivers consist of a Multiplier, Divider, Digital Filter, Digital Signal Processing, Real Time Timer Control and Interrupt Handlers.

A critical program is the Laser Power Control System (515); this system insures that the laser power is controlled in an accurate manner. The program contains Digital Servo Controls for the setting of the Laser Bias Current, Modulation Current, and Initial Manufacturing Variations of Parameters. Two types of Temperature Compensation are supported: the first is in-line compensation, which performs temperature laser adjustments without interrupting data transmission. The second type of compensation uses the breaks in data transmission in order to compensate for the laser temperature effects. The Laser Power Control System (515) also contains routines to model the thermal transfer characteristics for the various pieces of hardware utilized in the laser transceiver. The Control System (515) also contains a Dynamic Thermal Effects Model for determining transient thermal behavior of the laser depending on the characteristics of the signal to be transmitted. The Host I/O Communication (514) supports RS 232, Universal Serial Bus (USB) and Parallel Bus Communications with a Host Computer. The Optical Link Characterization (513) contains programs to support tests to determine the Bit Error Rate of the entire optical communications link including the transmitter and a remote receiver. For this purpose the Optical Link Characterization (513) controls a Test System Switch (TSS), (428) found in the Integrated Laser Communications Controller (320). The TSS (428) is utilized to route the different signals in the transceiver in order to perform the functions of the Optical Link Characterization. The program contains special routines to perform adjustments of parameters of the different electro-optical devices utilized in the communications transceiver. These adjustments can be performed remotely from a central control station or a node in the network For this purpose, the remote control station examines parameters such as Wavelength and Polarization and sends information back to the Integrated Laser Communication Controller (320) and instructs the controller (320) to perform any necessary adjustments. These adjustments are carried out in a closed loop control system to place communications transceiver in its optimal operating state. With the foregoing method, costly equipment is only required in one location of the network in an optical transmission system, it minimized costly service calls and increases system reliability because the laser and other devices can perform within prescribed limits. The feature is particularly important Dense Wavelength Division Multiplexing Systems where the laser wavelength needs to be continuously maintained within narrow limits. In this case, the wavelength can be periodically adjusted from a remote location by a host computer that is part of a system containing the necessary measuring instruments. The host computer returns instructions to the Integrated Laser Communications Controller. These instructions will adjust the appropriate hardware to tune the laser wavelength Other possible programs that can be connected to the operating system are an interface for Indirect Drive Electro-Optic Modulator Controls (510) and a MEMS Optical Switch Control (509). The embedded firmware contains a full set of Hardware Diagnostics Controls (511).

A key set of programs consists of Predicted Performance and Ageing Compensation (512). These programs contain aging compensation for Laser Bias Current, Laser Modulation Current and Photodiode Characteristic. Predicted performance is capable of analyzing with the use of feedback elements various characterizes of the laser. For example: linearity, discontinuities and other parameters. Another feature includes the measurements of system noise. This is required in order to set the Laser Bias Threshold to the appropriate value so that the laser does not turn off with a logic zero. This will cause the laser to fall into the spontaneous emission region, which would slow the laser response for switching to logic one.

Other programs can include Adaptive Threshold Bias and Adaptive Modulation of the laser. These programs allow for compensation of the drive as the laser experiences changes due to aging and temperature changes. For this purpose the Bias and Modulation Drives are set to a value that satisfies the optical transmission requirements but without over driving the laser. When the laser characteristic is determined to change due to aging or temperature, the Bias and Modulation Drives are adjusted accordingly in order to satisfy the optical transmission requirements. This approach extends the life of the laser.

A summary follows of the apparatus and methods of operation and unique features of the present invention.

1. An Integrated Laser Communications Controller.
2. A controller as in item 1 implemented in a single integrated circuit
3. A Controller as in number 2 containing several or all of the following elements:
   a microprocessor (401),
   ROM (402),
   RAM (403),
   non volatile RAM (404),
   External storage interface (437),
   Reset Generator (405),
   Clock Generator (406),
   Timers (407),
   Digital I/Os (408),
   Serial I/Os (409),
   Parallel I/Os (410),
   High performance operational amplifiers (415),
   Sample Hold Amplifiers (414),
   Analog Multiplexer (413),
   Programmable Gain Amplifier (413a),
   Analog to Digital Converter (411),
   Monitoring Photodiode Current Amplifiers (424),
   Digital to Analog Converters (416),
   Digital Potentiometers (417),
   Laser Power Control Interface (419),
   Laser Power Switch (420),
   Thermoelectric cooler drivers (418),
   Laser Over voltage and transient Protection (421),
   Precision Voltage Reference (427),
   Reference Drive Switch (426),
   Optical Link Characterization Circuits (425),
   Signal detector circuits (493),
   Wavelength detector support (423),
   Internal Chip diagnostics (422), and
   Receiver channel programmable gain amplifiers (424)
4. Other types of logic or mixed signal elements as in 3 used to control an Optical transceiver for fiber optics or space/air light wave communications.
5. A Controller as in 3 where the controller Integrated circuit may also include the Laser Driver for a single IC system.
6. A Controller as in 3 where the controller Integrated circuit contains D/A converters, which can have high current outputs to directly, drive laser bias currents.
7. A controller as in 5, where in addition to the driver, the controller may undergo special manufacturing processes to include one or more VCSEL lasers on the same Integrated Circuit.
8. A method of operation with an embedded real-time operating system, which orchestrates program execution.
9. A method of operation as in 8 with a Digital Servo Control system for Power Control
10. A method of operation as in 8 for Wavelength control.
11. A set of predictive performance algorithms, part of operating system in item 8 for laser with temperature and aging.
12. A set of predictive performance algorithms part of operating system in item 8 which dynamically adjust the bias and modulation drives reaching an adequate compromise to extend life and optimize signal to noise ratio.
13. A set of embedded hardware and firmware part of operating system in item 8 to determine Bit Error Rate and other laser parameters.
14. A program part of operating system in item 8 to allow remote central station calibration of wavelength with a remote computer and remote test and measurement equipment which sensing at the remote site of the laser signal and returns to the laser controller information used to close the loop and tune the wavelength.

What is claimed is:

1. A digital laser control system, comprising:
a plurality of sensors coupled to a laser, wherein the plurality of sensors are configured to generate feedback information associated with a plurality of laser performance parameters;
a digital laser controller coupled to the plurality of sensors, wherein the digital laser controller is configured to generate one or more laser driver control signals based on the feedback information, and wherein the digital laser controller comprises a first device configured to provide the one or more laser driver control signals as one or more voltage values to a laser driver that has a first circuit configuration and a second device configured to provide the one or more laser driver control signals as one or more resistor values to a laser driver that has a second circuit configuration, wherein the first circuit configuration includes current mirrors that are set with the one or more voltage values and the second circuit configuration includes current mirrors that are set with the one or more resistor values; and
a laser driver coupled to the laser and the digital laser controller, wherein the laser driver includes either the first circuit configuration or the second circuit configuration and is configured to produce one or more laser control signals based on the one or more laser driver control signals to control operation of the laser.

2. The digital laser control system of claim 1, wherein the one or more laser driver control signals comprise a laser modulation control signal.

3. The digital laser control system of claim 1, wherein the one or more laser driver control signals comprise a laser bias control signal.

4. The digital laser control system of claim 1, wherein the one or more laser control signals comprise a laser modulation current.

5. The digital laser control system of claim 1, wherein the one or more laser control signals comprise a laser bias current.

6. The digital laser control system of claim 1, wherein the plurality of sensors comprise a laser voltage sensor configured to generate feedback information that includes a voltage applied to the laser and a current sensor configured to generate feedback information that includes one or more currents applied to the laser.

7. The digital laser control system of claim 1, wherein the plurality of sensors comprise a photodiode sensor configured to generate feedback information that includes laser power output.

8. The digital laser control system of claim 1, wherein the plurality of sensors comprise a temperature sensor configured to generate feedback information that includes a temperature of the laser.

9. The digital laser control system of claim 1, wherein the plurality of sensors comprise a wavelength locker detector feedback sensor configured to generate feedback information that includes a wavelength of light output from the laser.

10. The digital laser control system of claim 1, wherein the laser controller further comprises firmware that includes control algorithms configured to generate the one or more laser control signals.

11. The digital laser control system of claim 1, wherein the laser controller further comprises non-volatile memory and a microprocessor, wherein the microprocessor is configured to execute one or more laser control algorithms stored in the non-volatile memory.

12. The digital laser control system of claim 1, wherein the laser controller further comprises nonvolatile memory, a microprocessor, and an operating system residing in the non-volatile memory, which when executed by the microprocessor, is configured to control execution of one or more programs and form an open driver interface for one or more user application programs.

13. The digital laser control system of claim 1, wherein the laser is a semiconductor laser.

14. The digital laser control system of claim 1, wherein the laser is a vertical cavity surface emitting laser (VCSEL) array.

15. The digital laser control system of claim 1, wherein the digital laser controller is further configured to disable laser power when the digital control system is energized during a power operation to prevent damage to the laser from one or more voltage transients.

16. The digital laser control system of claim 1, wherein the digital laser controller is further configured to control a set of thermo-electric cooler (TEC) drivers to maintain a temperature of the laser.

17. The digital laser control system of claim 1, wherein the first device is a digital-to-analog (D/A) converter configured to provide one or more voltages to the laser driver that has the first circuit configuration.

18. The digital laser control system of claim 1, wherein the second device is a potentiometer configured to provide one or more resistance values to the laser driver that has the second circuit configuration.

19. A method for laser control comprising:
receiving, by a laser controller, a modulation drive signal transmitted to a laser driver, wherein the laser controller receives the modulation drive signal to determine a magnitude of the drive signal;
receiving, by the laser controller, sensor information related to a plurality of laser performance parameters;
generating, by the laser controller, a first plurality of laser control signals based on the sensor information and the modulation drive signal, wherein the first plurality of laser control signals comprise one or more voltage values configured for a laser driver of a first configuration that includes current mirrors that are set with voltage values;
generating, by the laser controller, a second plurality of laser control signals based on the sensor information and the modulation drive signal, wherein the second plurality of laser control signals comprise one or more resistance values configured for a laser driver of a second configuration that includes current mirrors that are set with resistance values; and
controlling, by the laser controller, a laser based on either the first group of laser control signals or the second group of laser control signals.

20. The method of claim 19, wherein controlling the laser comprises adjusting laser power of the laser.

21. The method of claim 19, further comprising:
controlling, by the laser controller, a laser temperature of the laser with either the first plurality of laser control signals or the second plurality of laser control signals.

22. The method of claim 19, further comprising;
receiving, by the laser controller, a link characterization signal from a test and measurement device, wherein the link characterization signal is synchronized with the sensor information to obtain time-specific system data, wherein the time-specific system data is used to facilitate generation of the first plurality of laser control signals and the second plurality of laser control signals.

23. The method of claim 19, wherein generating the first plurality of laser control signals and generating the second plurality of laser control signals comprise generating a wavelength tuning output to adjust a laser output wavelength.

24. The method of claim 19, wherein generating the first plurality of laser control signals and generating the second plurality of laser control signals comprise generating a temperature output signal to maintain laser temperature at a determined value.

25. The method of claim 19, wherein controlling the laser comprises adjusting a laser output to compensate for an age of the laser.

26. The method for laser control of claim 19, wherein generating the first plurality of laser control signals comprises generating a plurality of voltage values configured for the laser driver of the first configuration.

27. The method for laser control of claim 19, wherein generating the second plurality of laser control signals comprises generating a plurality of resistance values configures for the laser driver of the second configuration.

28. An article of manufacture including a computer-readable medium having instructions stored thereon, that in response to execution by a laser control system, cause the laser control system to perform operations comprising:
receiving a modulation drive signal via a feedback path;
receiving sensor information related to a plurality of laser performance parameters;
generating a first plurality of laser control signals based on the sensor information and the modulation drive signal, wherein the first plurality of laser control signals include one or more voltage values configured for a laser driver that has a first circuit configuration that includes current mirrors that are set with voltage values;
generating a second plurality of laser control signals based on the sensor information and the modulation drive signal, wherein the second plurality of laser control signals include one or more resistance values configured for a laser driver that has a second circuit configuration that includes current mirrors that are set with voltage values; and
controlling a laser based on either the first plurality of laser control signals or the second plurality of laser control signals.

29. The article of manufacture of claim 28, wherein controlling the laser further comprises, adjusting laser power of the laser.

30. The article of manufacture of claim 28, wherein the operations further comprise:

controlling a laser temperature of the laser with either the first plurality of laser control signals or the second plurality of laser control signals.

31. The article of manufacture of claim 28, wherein the operations further comprise:
   receiving a link characterization signal from a test device, wherein the link characterization signal is synchronized with the sensor information to obtain time-specific system data.

32. The article of manufacture of claim 28, wherein generating the first plurality of laser control signals and generating the second plurality of laser control signals comprises generating a wavelength tuning output to adjust a laser output wavelength.

33. The article of manufacture of claim 28, wherein generating the first plurality of laser control signals and the second plurality of laser control signals comprises generating a temperature output signal to maintain laser temperature at a determined value.

34. The article of manufacture of claim 28, wherein generating the first plurality of laser control signals and the second plurality of laser control signals comprises generating a laser output adjustment signal to compensate for an age of the laser.

* * * * *

UNITED STATES PATENT AND TRADEMARK OFFICE
CERTIFICATE OF CORRECTION

| | | |
|---|---|---|
| PATENT NO. | : 7,949,025 B2 | Page 1 of 1 |
| APPLICATION NO. | : 10/513104 | |
| DATED | : May 24, 2011 | |
| INVENTOR(S) | : Olea | |

It is certified that error appears in the above-identified patent and that said Letters Patent is hereby corrected as shown below:

Column 1, line 8, delete "371of" and insert -- 371 of --.

Signed and Sealed this
Fourth Day of October, 2011

David J. Kappos
*Director of the United States Patent and Trademark Office*